United States Patent [19]

Bansemir

[11] Patent Number: 4,789,093
[45] Date of Patent: Dec. 6, 1988

[54] APPARATUS FOR ULTRASONIC WIRE BONDING

[75] Inventor: Manfred Bansemir, Dresden, German Democratic Rep.

[73] Assignee: VEB Elektromat Dresden, Dresden, German Democratic Rep.

[21] Appl. No.: 130,052

[22] Filed: Dec. 8, 1987

[30] Foreign Application Priority Data

Feb. 25, 1987 [DD] German Democratic Rep. .................................. 3001494

[51] Int. Cl.$^4$ .............................................. B23K 20/10
[52] U.S. Cl. ..................................... 228/1.1; 228/4.5; 228/13; 228/105; 219/56.21
[58] Field of Search ...................... 228/1.1, 4.5, 13, 41, 228/904, 110, 111, 105; 219/56.21

[56] References Cited

U.S. PATENT DOCUMENTS

| | | | |
|---|---|---|---|
| 4,351,468 | 9/1982 | Floury et al. | 228/4.5 |
| 4,475,681 | 10/1984 | Ingle | 219/56.21 |
| 4,550,871 | 11/1985 | Chan et al. | 219/56.21 |
| 4,619,395 | 10/1986 | Amorosi et al. | 228/4.5 |

Primary Examiner—Nicholas P. Godici
Assistant Examiner—Samuel M. Heinrich
Attorney, Agent, or Firm—Jordan and Hamburg

[57] ABSTRACT

The invention relates to an apparatus for ultrasonic wire bonding, whereby bonding loci can be interconnected by wire straps, by means of ultrasonic welding; in particular an apparatus in which bonding wire is guided and handled. According to the invention the bar (3) bearing the bonding head (2) has a longitudinal passage (4) in the direction of the ultrasound generator (35), which passage accommodates a guide tube (5) the upper end of which extends vertically upward out of the flange (6), near the rotational axis, and the lower end of which tube exits the bar (3) on an incline, in the outward direction, in the region of the mounting of the bonding head. A deflecting element (24) for the wire (40) is disposed above the upper end of the guide tube (5) and is not coupled with the rotational movement. The fact that the supply reel is mounted at a fixed location enables the employment of all customarily used type of reels, associated mounting means, and auxiliary elements for withdrawing the wire.

14 Claims, 3 Drawing Sheets

APPARATUS FOR ULTRASONIC WIRE BONDING

BACKGROUND OF THE INVENTION

The invention relates to an apparatus for ultrasonic wire bonding, whereby bonding loci can be interconnected by wire straps, by means of ultrasonic welding. For example, the apparatus may be used to connect terminals on component mounts to bonding islands on semiconductor chips.

In known apparatuses for ultrasonic wire bonding, as a rule the wire to be welded is fed through an inclined bore in the longitudinal direction of the ultrasound generator, which bore is disposed behind the welding surface of a sonotrode. This customary arrangement requires that prior to the fixing of each wire strap the connecting orientations at the two connecting loci of the strap must be aligned with the axial direction of the ultrasound generator.

For this purpose, either the component mount or a bonding head which includes the ultrasound generator must be aligned in the required direction. When automatic apparatus is used for certain areas of application, e.g. for operations on so-called hybrid components, it is advantageous to proceed by adjusting the bonding head.

Known apparatuses of this type have a bonding head which is rotatable around a vertical axis which axis approximately passes through the welding surface at the foot of the sonotrode, and the bonding head as a rule is also movable vertically. In addition, all known embodiments have an optical device disposed near the axis of rotation, whereby the component being operated on can be depicted on a monitor by means of a television camera. In these apparatuses the wire is generally fed through a bore in the bonding snout which bore is inclined to the horizontal at an angle of approximately 30° to 60°. Ordinarily, pincers are provided for the automatic advancing and cutting of the wire, whereby the wire is clamped in two pincer jaws behind the sonotrode. The wire is advanced under the welding surface of the sonotrode prior to the execution of the first welded connection by advancing the pincer jaws in the longitudinal direction of the wire being fed, in a manner coordinated with the clamping movements of the said pincer jaws. Then after the second welded connection of the wire strap has been executed, the wire is severed at the rear edge of the welding surface of the sonotrode.

In known apparatuses having a rotatable and vertically movable bonding head, the supply reel for the wire is disposed on the bonding head. This arrangement necessitates the use of a relatively small and light wire supply reel, in order to afford the free space required particularly for the rotation of the bonding head, and to minimize the moment of inertia around the rotational axis.

There are apparatuses known in the art (described, e.g., in U.S. Pat. No. 4,239,144) wherein an ordinary light reel having a diameter of approximately 12.5 mm and length of 19 mm is rotatably inserted on a shaft on the bonding head. When the wire strap is being formed, the wire is unreeled from the reel. A disadvantage of this arrangement is the need to accelerate and rotate the reel body. This causes fluctuations in the wire tension. As a result it is difficult to reliably provide a test voltage on the bonding wire, which voltage is needed for electrical monitoring of bond quality. A further disadvantage is that the reels used are unsuitable for wires of diameter greater than 0.05 mm.

Also known in the art is an apparatus wherein the wire is withdrawn from the end face of a reel body which is held fixed on the bonding head. The reel body is smaller than the usual reel body used for this type of wire feeding. Disadvantages of this arrangement are that the amount of wire which can be held on one reel is less and the reels used are suitable only for thin wires. Further, the space requirements for the reels and their mountings are relatively large.

SUMMARY OF THE INVENTION

The object of the invention is to devise an apparatus for ultrasonic wire bonding, with the aid of which apparatus the full range of customary wire supply reels is usable, favorable conditions for automatic monitoring of bonding quality are created, and higher operating speeds are attainable in the production of wire connections.

The present invention therefore provides an apparatus for ultrasonic wire bonding, which apparatus comprises wire feed means wherein the wire supply reel is mounted at a fixed location outside the rotatable and vertically movable bonding head, and wherein the withdrawal tension on the wire during the production of the wire connections is small, constant, and reproducible.

The point of departure from the prior art is to provide apparatus for ultrasonic wire bonding wherein the bonding wire is fed through inclined bores in the bonding "snout" and sonotrode, and is advanced and severed by pincer jaws disposed behind the sonotrode, and wherein the bonding head. comprised essentially of the ultrasound generator with sonotrode and a pincer mechanism, is affixed to a bar, wherein the bar has an eccentric longitudinal bore with a microscope objective screwed into the lower opening of said bore, and has a centrally affixed flange at its upper end face, and wherein he bar is mounted in a combined axial and radial guiding mount in which it can be moved vertically in the direction of the sonotrode axis, by a first drive system, and can be rotated around its axis, which axis passes approximately through the center of the welding surface at the foot of the sonotrode, with the rotation being accomplished by a second drive system independent of the first drive system.

The aforesaid underlying problem is solved according to the invention in that the bar has a longitudinal passage in the direction of the ultrasound generator, for feeding of the wire. A guide tube is installed in this longitudinal passage. The upper end of this guide tube extends vertically upward out of the flange, near the rotational axis, and the lower end of the tube exits the bar in the region of the mounting of the bonding head, i.e. below the combined axial and radial guide means for the bonding head The direction at which the tube exits is approximately the direction of the tangent of the upper circumferential region of a deflecting rod mounted on the bonding head. A deflecting element for the wire is disposed above the upper end of the guide tube, which deflecting element is not coupled with the rotational movement. The supply reel for the wire is mounted at a fixed location outside the guiding system for the bonding head. The wire from said reel passes over the said deflecting element above the guide tube, and proceeds into the guide tube. After the wire exits the guide tube it is passed over the deflecting rod mounted on the bonding head, where said wire is deflected into the direction of the inclined bore in the bonding snout and passes through this bore and through the clamping jaws of the pincer device, to the sonotrode. Because of the fixed relationship of the bonding head, optical system, and guide tube, and the wire entrance near the rotational axis, angular adjustment of the bonding head presents no problems with regard to feeding the wire.

According to an advantageous refinement of the invention, the deflecting rod is mounted on a lever which is pivotable around a pivot parallel to said rod, wherewith the lever is pulled inward (in relation to the wire) against a detent, by means of a tensile spring. The lever has a pin mounted on it which extends parallel to the pivot of the lever. An extension member is mounted on the radial guide bushing for the bonding head, the height of which extension member is adjustable. When the bonding head is raised, the extension member can press the pin outward, thereby also moving the deflecting rod outward with respect to the bonding wire. The extension member is adjusted such that this outward movement will be brought about in the upper range of the raising of the bonding head, after a wire strap has been installed. At this point the wire pincers are closed, and wire is drawn from the supply reel by the movement of the deflecting rod.

According to another advantageous refinement of the invention, the deflecting element disposed above the guide tube is attached to a lever which serves to transmit the vertical movement from the drive means to the flange of the bar (to move the bar vertically). In still another refinement, after the guide tube exits from the bottom of the bar it undergoes an "S" bend, first being bent outward then inward, whereby its end direction approximately coincides with the direction of the bore in the bonding snout, wherein the wire passes from the guide tube into said bore without any additional deflection. It is also advantageous if the guide tube is mounted in such a way as to be electrically isolated from the other parts of the apparatus, or is fabricated of electrically insulating materials.

BRIEF DESCRIPTION OF THE DRAWING

The invention will be described in more detail hereinafter with reference to the accompanying drawings.

DETAILED DESCRIPTION OF THE EMBODIMENT

Figure 1:
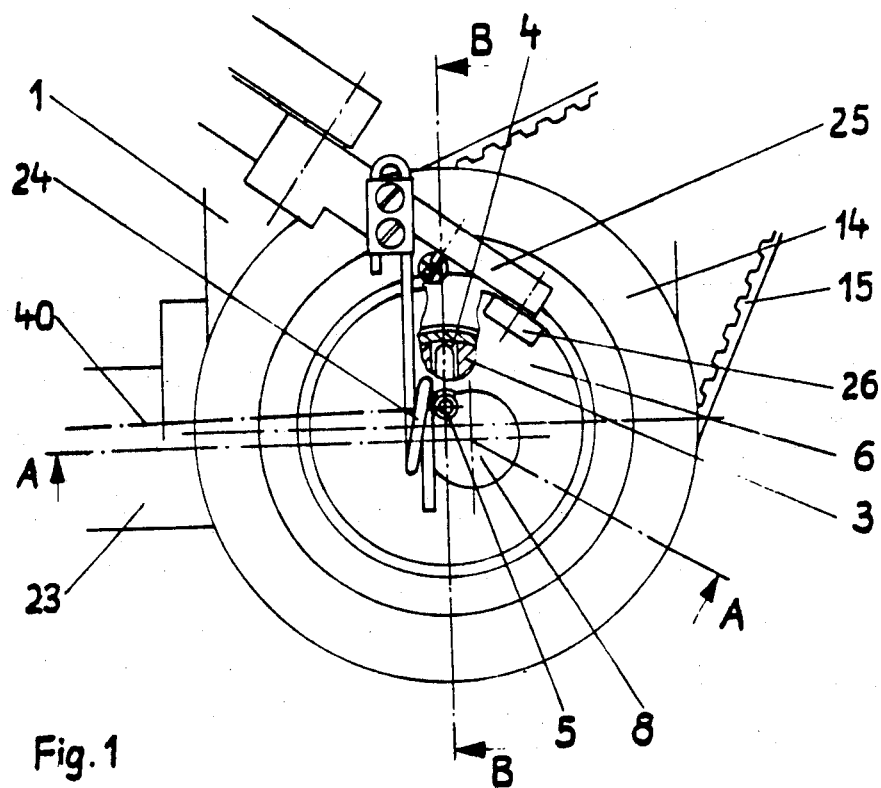
FIG. 1 is a partial plan view of the apparatus.

The apparatus for ultrasonic wire bonding according to FIGS. 1 to 4 is disposed in a frame (not shown) via a base body 1. The apparatus base body 1 of the apparatus may be fixed in place or mounted on a table movable in the x- and y-directions.

A play-free, adjustable, two-row ball bearing serves as the radial guide means for the bonding head 2. The outer race 9 of the bearing is held in the base body 1. The inner race 10 of the bearing also serves as the outer race of a concentric longitudinal guide bushing for the bonding head 2, which bushing is further comprised of an inner race 11 and a ball bearing cage 12 with bearing balls 13. The controllable rotational movement of the bonding head 2 is transmitted from a rotational drive mounted on the base body 1, via a toothed belt 15, to a mating pulley 14 screwed onto the upper end face of the inner race 10. A drum 16 is affixed to the lower end face of the inner race 10, for attaching and guiding flexible electrical leads 17 for the bonding head 2.

The bonding head 2 is essentially comprised of the ultrasonic generator 35 (with bonding snout 36 and sonotrode 39), the mount for the ultrasound generator, and a pincer mechanism (not illustrated in detail) with the pincers 38 for advancing and severing the wire. The bonding head 2 is attached to the end of a bar 3 such that the axis of the bar is parallel to that of the sonotrode and runs approximately through the welding surface at the foot of the sonotrode.

The bar 3 is mounted in the inner race 11 of the guide bushing, and is pulled tightly and fixedly toward a flange 6 at its upper end face by means of screws. The flange 6 also serves to receive the controlled means of actuation of the vertical movement of the bonding head 2. For this purpose, its outer edge region is engaged, on the upper and lower faces, by two rollers 26 which are connected, via a lever mechanism, to a vertical drive mounted on the base body 1.

A pin 19 is mounted in the drum 16 attached to the inner race 10, which pin 19 runs parallel to the axis of rotation. Two rollers 18 disposed on the bonding head 2 lie against pin 19, engaging it from opposite sides and thereby transmitting the rotational movement to the bonding head 2 and to the bar 3 attached to head 2.

The bar 3 and flange 6 have an eccentric bore 8 into which a microscope objective 20 is screwed from below. The bore 8 is disposed laterally with respect to the ultrasound generator 35 and near the pivot axis of said generator. In particular, the bore 8 is forward of the sonotrode axis. A television camera 21 (or in a variant embodiment, another set of image-forming optics) is disposed at a certain distance above the exit opening of the eccentric bore 8. A half-silvered mirror 22 may be disposed at a 45° angle to the axis, above the microscope objective 20. The object lying under the objective 20 can be illuminated by an illuminating device 23 mounted on the base body 1, via the mirror 22 and with the aid of transverse bores in the bar 3 and in the guide elements, when the apparatus is in the base position illustrated in FIG. 1.

The bar 3 has a longitudinal passage 4 running in the direction of the ultrasound generator 35, which passage serves as an opening for feeding the ultrasonic wire 40. A guide tube 5 is inserted in this longitudinal passage 4. The upper end of tube 5 extends vertically out of flange 6, near the rotational axis but out of the region of the eccentric bore 8 in which region the optical system is operative. A deflecting element 24 is disposed above the end of tube 5. In the embodiment illustrated, element 24 is in the form of a closed loop of wire. The lower end of guide tube 5 extends out of the bar 3 at an angle, in the region of the attachment of the bonding head.

A deflecting rod 27 is disposed on the bonding head 2, such that its circumference is approximately tangent to the center line of the bore 37 in the bonding snout 36, and to the direction of the end of the guide tube 5. The bonding wire 40 enters the apparatus in a horizontal or downwardly sloped direction, from a supply reel (which will not be further described here) mounted on the base body 1 outside the guide means for the bonding head. Wire 40 passes over deflecting element 24, through guide tube 5, and around deflecting rod 27, to the bore 37 in the bonding snout 36, and thence through the clamping jaws of the pincers 38, to the sonotrode 39. The elements which guide the wire are mounted in such a way that they are electrically isolated from the other parts of the apparatus; or they are comprised of electrically insulating materials. Preferably a glass tube is used as the guide tube 5.

In the exemplary embodiment the deflecting rod 27 is mounted on a lever 29 which is pivotable around an axis 28 which is parallel to rod 27. A tensile spring 30 pulls the deflecting rod 27 inward until an adjustable detent 31 is encountered. Rod 27 is thereby adjustable with respect to the bonding wire 40. Lever 29 bears a pin 32 extending parallel to the pivot 28. Above pin 32, a pin 33 mounted in the drum !6 has an extension member 34 the height of which is adjustable.

When the bonding head 2 is raised, the member 34 can press the pin 32 outward, thereby also moving the deflecting rod 27 outward in relation to the bonding wire 40. The extension member 34 is adjusted such that this movement is executed in the upper region of the lifting stroke, after a wire strap has been emplaced. At this point the wire pincers 38 are closed, and wire 40 is drawn from the supply reel by the movement of the deflecting rod 27.

When the bonding head 2 is lowered to form the next wire strap, the deflecting rod is moved back inward, thereby forming a loose reserve of wire in the region above the bonding snout 36. It is thus unnecessary to draw any additional wire from the supply reel while the operations to form the wire strap are being carried out. During this operating period, the bonding head 2 is not lifted far enough for the deflecting rod 27 to be dislodged from its inner terminal position.

Figure 2:
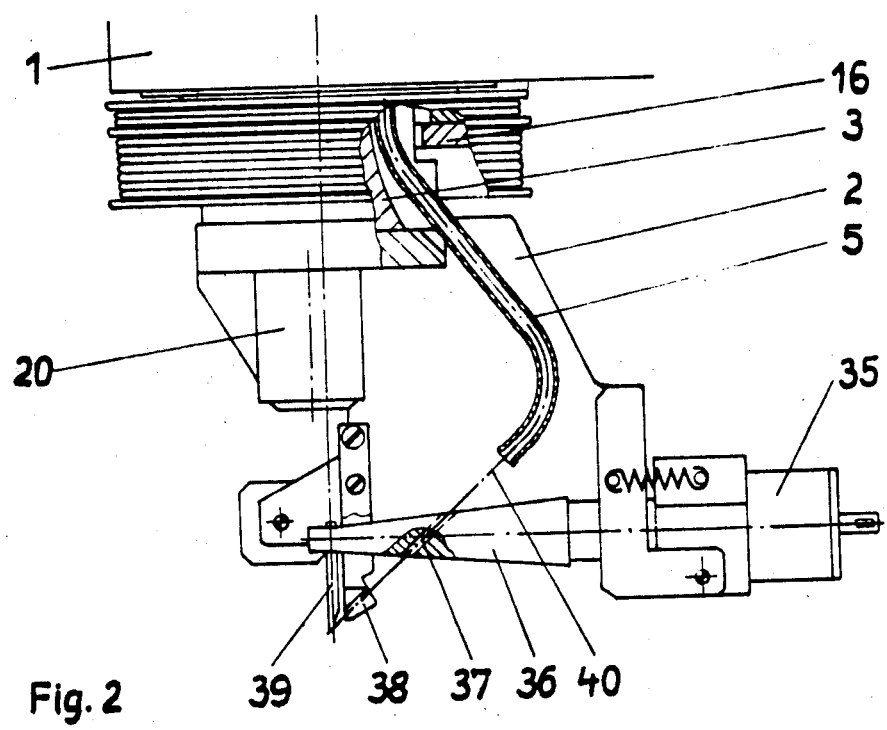
FIG. 2 is a partial side view.
Figure 3:
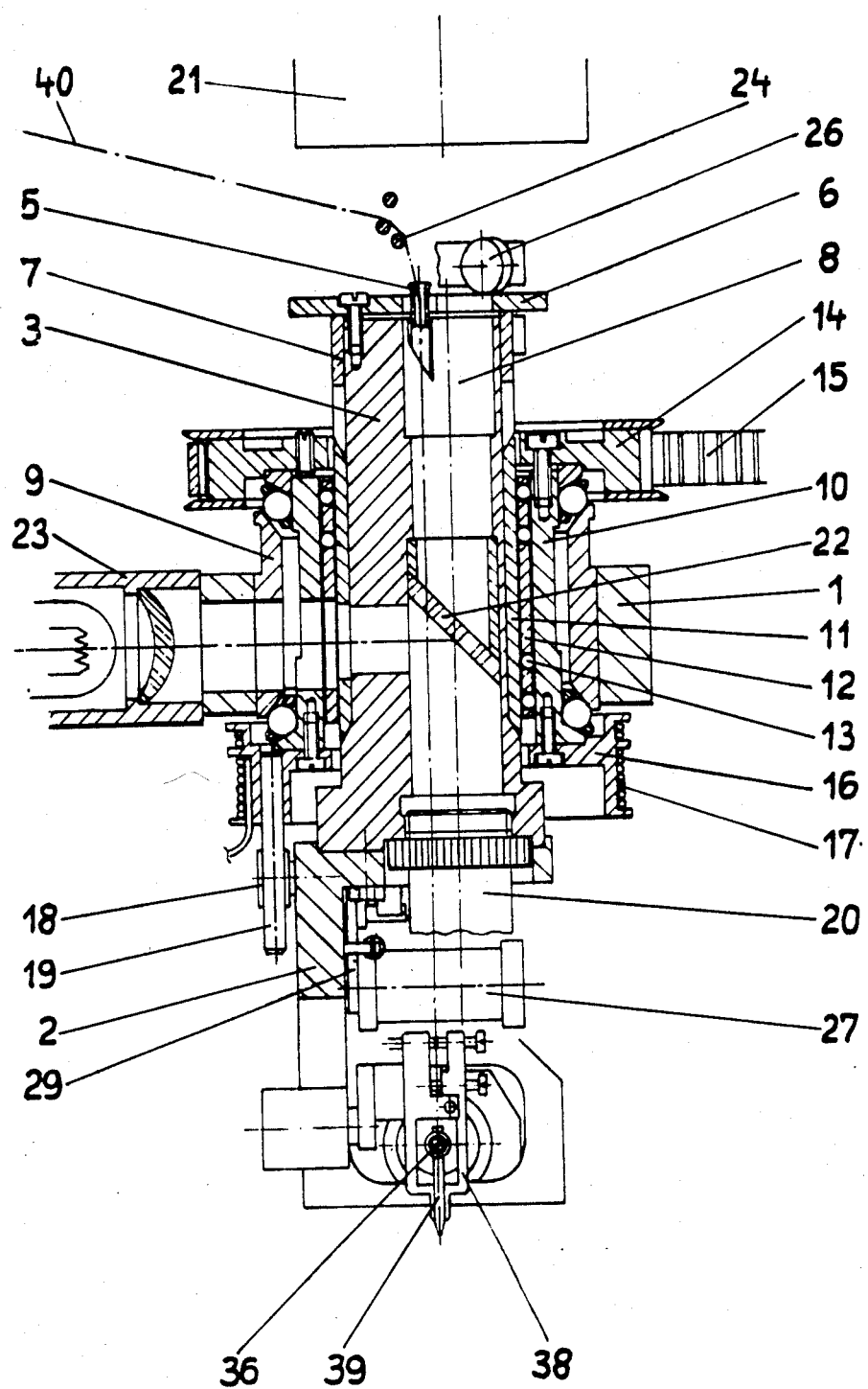
FIG. 3 is a cross sectional view of the bonding head guide means, through line A—A of FIG. 1.
Figure 4:
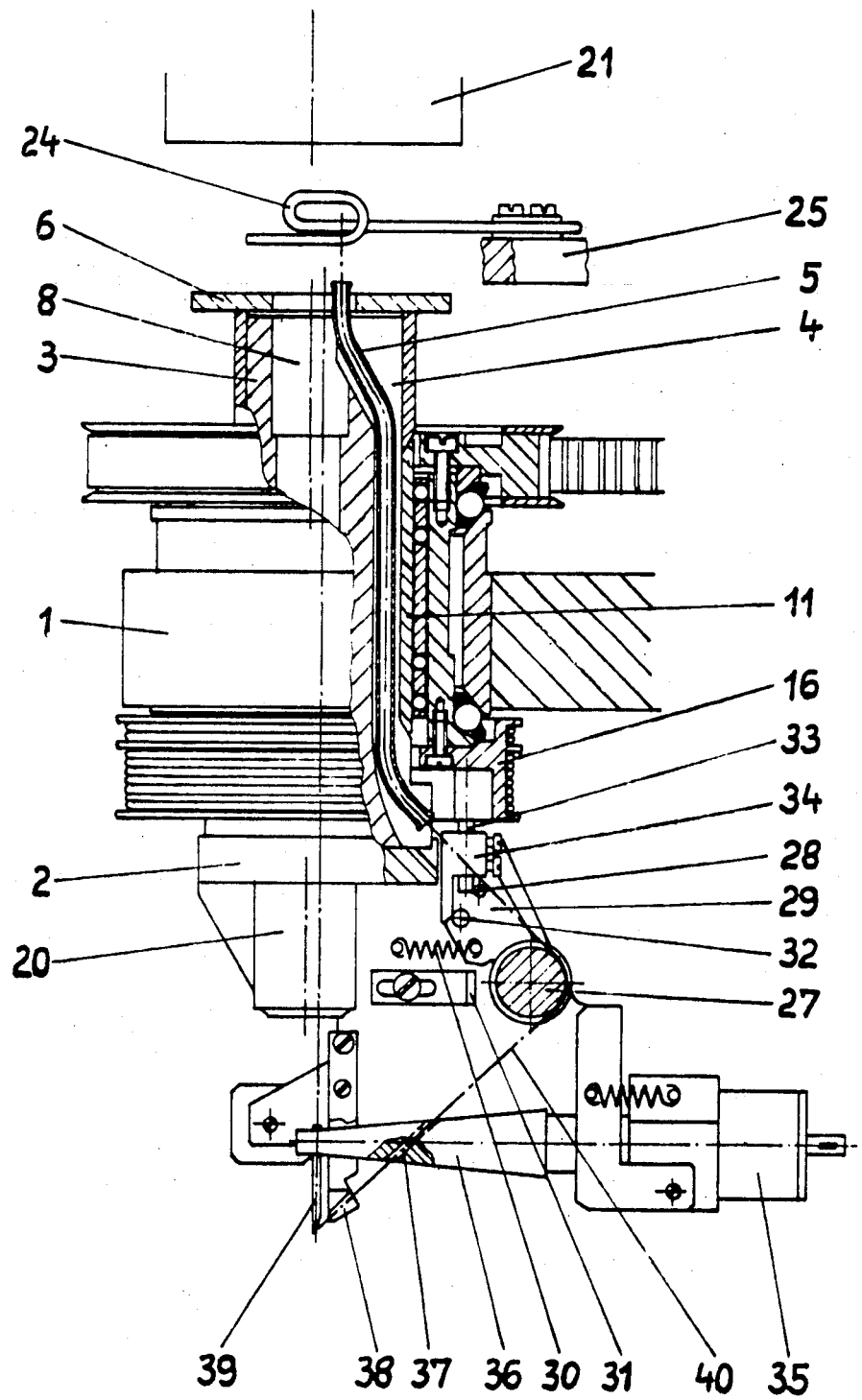
FIG. 4 is a side view of the apparatus with a partial cross section through line B—B of FIG. 1.

In a second embodiment, illustrated in FIG. 2, the deflection of the bonding wire 40 into the direction of the inclined bore 37 in the bonding snout 36 is accomplished in the guide tube 5 itself. For this purpose, the guide tube 5 extends through an "S" curve, with first an outward bend then an inward one, after it exits the bar 3, and ends approximately in the direction of the bore 37.

In the exemplary embodiment the deflecting element 24 is mounted on a lever 25 which lever serves to transmit the vertical movement to the flange 6. In this way, element 24 follows the vertical movement, thereby avoiding any deviation in the distance between the deflecting element 24 and the sonotrode 39, which deviation would have an influence on the wire.

I claim:

1. An apparatus for ultrasonic wire bonding comprising:
   a sonotrade having an axis and a foot which defines a welding surface;
   a bonding snout having inclined bore means for feeding a bonding wire to said sonotrade;
   pincer means disposed behind the sonotrode for advancing the bonding wire to said sonotrode and for severing the bonding wire;
   an ultrasound generator;
   bonding head means for supporting said sonotrode, ultrasound generator and pincer means;
   bar means for supporting said bonding head means, said bar means including:
   an eccentric longitudinal bore with a lower opening;
   a centrally affixed flange at an upper end face thereof;
   a longitudinal passage extending in a direction toward the ultrasound generator;
   a microscope objective screwed into the lower opening of said longitudinal bore;
   combined axial and radial guiding mount means for mounting said bar means for vertical movement in the direction of said sonotrode axis and for rotational movement about a rotational axis of said guiding mount means, said axis of said guiding mount means passing approximately through the center of the welding surface at the foot of the sonotrode;
   first drive means for moving said guiding mount means in
   the direction of said sonotrode axis;
   second drive means for rotating said guiding mount means about the axis of the guiding mount means, said second drive means being independent of the first drive means;
   a deflecting rod mounted on the bonding head means, said deflecting rod having a lower circumferential region approximately tangential to the direction of the inclined bore means in the bonding snout, and having an upper cicumferential region;
   a guide tube positioned in said longitudinal passage and having an upper end extending vertically upward out of the centrally affixed flange near the rotational axis of said guiding mount means and a lower end which exits said bar means below the guiding mount means at an incline to the rotational axis thereof in a direction of a tangent to the upper circumferential region of the deflecting rod;
   a deflecting element, which is not rotationally coupled with said bar means, positioned a predetermined distance above the upper end of the guide tube;
   wherein the bonding wire approaches the apparatus in a direction having a horizontal component, passes over the deflecting element, extends through the guide tube, around the deflecting rod, through the bore mean in the bonding snout, to the pincer means and to the sonotrode.

2. Apparatus according to claim 1; wherein said guide tube is electrically isolated from remaining elements of said apparatus.

3. Apparatus according to claim 2; wherein said guide tube is made of an electrically insulating material.

4. Apparatus according to claim 3; wherein said guide tube is made of glass.

5. Apparatus according to claim 1; further comprising:
   lever means for pivotally mounting said deflecting rod, said lever means including a pivot pin parallel to said deflecting rod and about which said deflecting rod is pivoted;
   a detent;
   biasing means for pulling said deflecting rod inwardly against said detent;
   an adjustment pin mounted on said lever means and extending parallel to said pivot pin;
   an extension member mounted on the guiding mount means above said adjustment pin and movable vertically with respect to said adjustment pin with said bonding head means, bar means and guiding mount means such that said extension member presses said adjustment pin outward upon upward movement of said extension member to pivot said deflecting rod outwardly about said pivot pin.

6. Apparatus according to claim 1; further including lever means for transmitting vertical movement from the first drive means to the flange of the bar means and for mounting said deflecting element.

7. Apparatus according to claim 1; wherein said guide tube, after exiting said bar means at its lower end, undergoes first an outward bend and then an inward bend so as to extend in a direction which approximately coincides with the direction of the inclined bore means in the bonding snout, and wherein the bonding wire passes from the guide tube in the inclined bore means in the bonding snout without any additional deflection.

8. An apparatus for ultrasonic wire bonding comprising:

- a sonotrode having an axis and a foot which defines a welding surface;
- a bonding snout having inclined bore means for feeding a bonding wire to said sonotrode;
- pincer means disposed behind the sonotrode for advancing the bonding wire to said sonotrode and for severing the bonding wire;
- an ultrasound generator;
- bonding head means for supporting said sonotrode, ultrasound generator and pincer means;
- bar means for supporting said bonding head means, said bar means including a longitudinal passage extending in a direction toward the ultrasound generator;
- combined axial and radial guiding mount means for mounting said bar means for vertical movement in the direction of said sonotrode axis and for rotational movement about a rotational axis of said guiding mount means, said axis of said guiding mount means passing approximately through the center of the welding surface at the foot of the sonotrode;
- a deflecting rod mounted on the bonding head means, said deflecting rod having a lower circumferential region approximately tangential to the direction of the inclined bore means in the bonding snout, and having an upper circumferential region;
- a guide tube positioned in said longitudinal passage and having an upper end extending vertically upward out of the bar means near the rotational axis of said guiding mount means and a lower end which exits said bar means below the guiding mount means at an incline to the rotational axis thereof in a direction of a tangent to the upper circumferential region of the deflecting rod;
- a deflecting element, which is not rotationally coupled with said bar means, positioned a predetermined distance above the upper end of the guide tube;

wherein the bonding wire approaches the apparatus in a direction having a horizontal component, passes over the deflecting element, extends through the guide tube, around the deflecting rod, through the bore means in the bonding snout, to the pincer means and to the sonotrode.

9. Apparatus according to claim 8; wherein said guide tube is electrically isolated from remaining elements of said apparatus.

10. Apparatus according to claim 9; wherein said guide tube is made of an electrically insulating material.

11. Apparatus according to claim 10; wherein said guide tube is made of glass.

12. Apparatus according to claim 8; further comprising:

- lever means for pivotally mounting said deflecting rod, said lever means including a pivot pin parallel to said deflecting rod and about which said deflecting rod is pivoted;
- a detent;
- biasing means for pulling said deflecting rod inwardly against said detent;
- an adjustment pin mounted on said lever means and extending parallel to said pivot pin;
- an extension member mounted on the guiding mount means above said adjustment pin and movable vertically with respect to said adjustment pin with said bonding head means, bar means and guiding mount means such that said extension member presses said adjustment pin outward upon upward movement of said extension member to pivot said deflecting rod outwardly about said pivot pin.

13. Apparatus according to claim 8; wherein said bar means includes a centrally affixed flange at an upper and face thereof; and said apparatus further includes first drive means for moving said guiding mount means in the direction of said sonotrode axis; second drive means for rotating said guiding mount means about the axis of the guiding mount means, said second drive means being independent of the first drive means; and lever means for transmitting vertical movement from the first drive means to the flange of the bar means and for mounting said deflecting element.

14. Apparatus according to claim 8; wherein said guide tube, after exiting said bar means at its lower end, undergoes first an outward bend and then an inward bend so as to extend in a direction which approximately coincides with the direction of the inclined bore means in the bonding snout, and wherein the bonding wire passes from the guide tube in the inclined bore means in the bonding snout without any additional deflection.

* * * * *